United States Patent
Kuehn

(10) Patent No.: US 7,626,466 B2
(45) Date of Patent: Dec. 1, 2009

(54) PROXIMITY SWITCH AND METHOD FOR OPERATING A PROXIMITY SWITCH

(75) Inventor: Thomas Kuehn, Manheim (DE)

(73) Assignee: Pepperl + Fuchs GmbH, Mannheim (DE)

( * ) Notice: Subject to any disclaimer, the term of this patent is extended or adjusted under 35 U.S.C. 154(b) by 95 days.

(21) Appl. No.: 11/813,728

(22) PCT Filed: Jan. 10, 2006

(86) PCT No.: PCT/EP2006/000146

§ 371 (c)(1),
(2), (4) Date: Jul. 11, 2007

(87) PCT Pub. No.: WO2006/074899

PCT Pub. Date: Jul. 20, 2006

(65) Prior Publication Data

US 2008/0143448 A1    Jun. 19, 2008

(30) Foreign Application Priority Data

Jan. 13, 2005   (DE) .................. 10 2005 001 692

(51) Int. Cl.
- H03L 1/02 (2006.01)
- H03B 5/04 (2006.01)
- H03K 17/95 (2006.01)
- G01B 7/14 (2006.01)

(52) U.S. Cl. .................. 331/65; 331/66; 331/167; 331/176; 324/207.16; 324/207.26; 324/236; 361/180

(58) Field of Classification Search ............ 331/65, 331/66, 167, 176; 307/116, 125; 324/207.16, 324/207.26, 236; 361/179, 180
See application file for complete search history.

(56) References Cited

U.S. PATENT DOCUMENTS 3,805,185 A * 4/1974 Kishi et al. .............. 331/65

(Continued)

FOREIGN PATENT DOCUMENTS

DE          3931892 A1    9/1989

(Continued)

OTHER PUBLICATIONS

Deliyannis et al., "Continuous-Time Active Filter Design", XP-002384932, CRC Press LLC, Boca Raton, 1999.

(Continued)

Primary Examiner—Robert Pascal
Assistant Examiner—Levi Gannon
(74) Attorney, Agent, or Firm—John A. Merecki; Hoffman Warnick LLC

(57) ABSTRACT

The invention relates to a proximity switch, particularly an inductive proximity switch, with an oscillator having an at least partly self-compensated feedback network influenceable by a target to be detected, as well as an oscillator amplifier. The invention is characterized in that the oscillator amplifier has an amplifier component and a controllable network for controlling the gain of the oscillator amplifier, that the controllable network has a passive coupling network, particularly negative feedback network, and a controllable transconductance amplifier for controlling a transfer function of the controllable network, that a temperature sensor for determining the temperature of at least the oscillator amplifier is provided and a signal derived from an output signal of the temperature sensor is used as a control signal for the transconductance amplifier, and that the oscillator amplifier on the basis of the temperature determined by the temperature sensor by means of the transconductance amplifier is controllable in such a way that temperature-caused variations of the oscillator characteristics are at least partly compensatable.

14 Claims, 7 Drawing Sheets

U.S. PATENT DOCUMENTS

Figure 1:
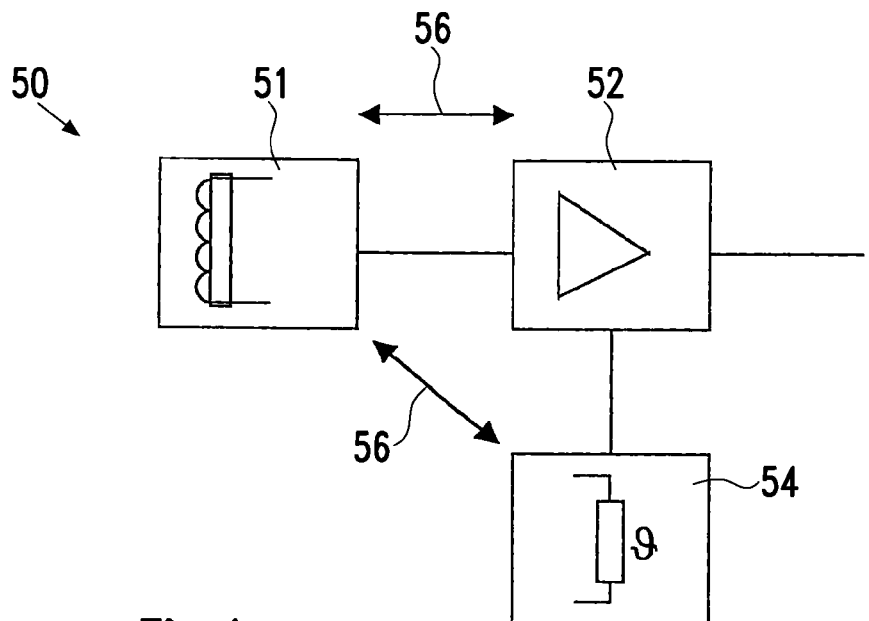

| | | | | |
|---|---|---|---|---|
| 4,942,372 A | * | 7/1990 | Heimlicher | 331/65 |
| 5,012,206 A | * | 4/1991 | Tigges | 331/65 |
| 5,043,679 A | * | 8/1991 | Kriz et al. | 331/65 |
| 5,079,502 A | * | 1/1992 | Rogacki et al. | 324/207.19 |
| 5,180,978 A | * | 1/1993 | Postma et al. | 324/207.16 |
| 5,264,733 A | * | 11/1993 | Tigges | 307/116 |
| 6,031,430 A | * | 2/2000 | Heimlicher | 331/65 |
| 6,259,333 B1 | | 7/2001 | Shimono | |
| 6,657,323 B2 | * | 12/2003 | Muller | 307/116 |

FOREIGN PATENT DOCUMENTS

| | | |
|---|---|---|
| EP | 0 070 796 A1 | 6/1982 |
| EP | 0 319 470 A1 | 11/1988 |
| WO | 2006074899 A3 | 7/2006 |

OTHER PUBLICATIONS

International Search Report, PCT/EP2006/000146, pp. 1-3, Jun. 23, 2006.

International Preliminary Examination Report, (in German), PCT/EP2006/000146, pp. 1-10, Apr. 23, 2007.

* cited by examiner

PROXIMITY SWITCH AND METHOD FOR OPERATING A PROXIMITY SWITCH

The present invention relates to a proximity switch, particularly an inductive proximity switch, as well as to a method for operating an inductive proximity switch.

Such a proximity switch has an oscillator with an at least partly self-compensated feedback network influenceable by a target to be detected and with an oscillator amplifier.

The measured quantity used with proximity switches is generally a change to the resonance impedance of the resonant circuit when the target to be monitored approaches the proximity switch.

As these changes to the resonance impedance are comparatively small hitherto only small switching intervals have been obtainable. Thus, with the "M 18, shielded" design, e.g. the resonance impedance change when the target approaches from a considerable distance is only approximately 0.3% on passing to three times the standard switching interval. However, with this design, the change on approach to the standard switching interval is still approximately 30% of the resonance impedance.

The magnitude of the observed resonance impedance change limits the maximum obtainable switching interval, because the temperature dependences of the relevant physical characteristics of the components used lead to considerable, non-negligible resonance impedance changes. Therefore, up to now only comparatively small switching intervals have been implementable and are fundamentally dependent on the design.

A part is played by component tolerances, particularly electrical and mechanical absolute tolerances, together with manufacturing tolerances, i.e. relative tolerances. Variations also result from the dependence of electrical parameters on manufacturing tolerances, e.g. of positioning tolerances of the winding relative to the core.

The quality of the components used must also be taken into account. As a result of component and material ageing, there can e.g. be drifts of electrical parameters. Finally, ageing processes can also modify and/or deteriorate any joints, e.g. bonded joints, which in turn leads to changes and drifting of the relevant electrical parameters. Thus, in electronic circuits there can e.g. be separations and substances from the environment can be resorbed.

Admittedly a number of measures have already been proposed making it possible to compensate temperature effects in the case of proximity switches. However, they are very complicated from the process and/or circuitry standpoints and also are not completely satisfactory with regards to the results obtained. In particular, the specimen or exemplary compensation obtained at room temperature has proved inadequate. It is also insufficient to only compensate the first order temperature dependences, because sometimes there are considerable second and third order contributions, which must be minimized or at least partly compensated. Hitherto e.g. a NTC network has been used for this purpose. However, further improvements involving considerable costs imply a multistage or multiple compensation or multistage adjustment. Moreover, beyond a temperature compensation over an interface to be provided following the final installation of the proximity switch a compensation or adjustment can take place.

In a conventional system higher switching intervals have essentially been impossible for the following reasons. Firstly temperature gradients between the coil system and the amplifier on the one hand and between the coil system and a possibly present compensation network on the other lead to errors during temperature changes. In addition, the adaptation between the compensation network and the amplifier/coil system can only be performed to a limited extent. Finally, due to parameter spreads and manufacturing tolerances of both the components used in the coil system and in the overall structure, only a limited reproducibility is obtainable.

In a complicated variant of an electronic specimen compensation only performed at room temperature a resistance network is set or programmed digitally. Correspondingly control currents can also be digitally set or programmed. A communication can take place by means of the supply lines. An example appears in DE 197 02 059° C.2.

A particularly elegant method for compensation a main component of the indicated temperature dependences, namely the temperature coefficient of the copper resistance of the resonant coil circuit, is given in EP 0 070 796. The positive feedback network described therein, which in particular has two antiserial, inductively coupled coils, can consequently also be referred to as a self-compensated positive feedback network, i.e. whose transmission at a given frequency and component parametrization is ideally only determined by the damping of the coils by a target to be detected. A further development of the circuit described in EP 0 070 796 is disclosed in EP 0 319 470 A1. In order to be able to compensate losses with copper-unequal temperature coefficients, the negative feedback path is subdivided into two partial paths. The first of these partial paths has a temperature dependence such that there is as a consequence a compensation of the resonant circuit losses with copper-equal temperature coefficients. The second negative feedback path, in the simplest case via an ohmic resistor, permits the compensation of the temperature variation brought about by the dissipative components with copper-unequal temperature coefficients, field-induced losses in the housing or proximity losses in the coil.

DE 100 46 147 also discloses a relatively complicated method. A three-stage adjustment procedure is performed by communication via supply lines. Firstly type-specific adjustments for the oscillator characteristic are performed using a total current from weighted current sources with different characteristics. Then for compensating exemplary variations at room temperature a compensation or adjustment is performed by programming a digital resistance network. Finally, for compensating exemplary variations there is a temperature adjustment over a digitally adjustable comparator threshold. However, it has not been clarified to what extent the structure and method described therein proves adequate for a satisfactory efficiency level. It is also a complicated method requiring a definition of the characteristics. The component expenditure is also considerable and e.g. two ASICs are needed. Finally, mechanical and structural restrictions result from the necessary thermal coupling.

DE 201 08 904 U1 describes an inductive proximity switch for the material-independent detection of metal objects. In order to permit using simple means a material-independent detection of nonferrous and ferromagnetic metals, it proposes a proximity switch in which the coil winding is now made at least partly from a resistance alloy instead of, as hitherto, from a highly conductive material. However, no temperature compensation takes place.

A further alternative for compensating temperature effects is described in DE 195 27 174 A1. In the proximity switch disclosed therein the switching threshold is varied as a function of a signal of a temperature sensor at the oscillator.

DE 39 31 892 A1 also relates to a proximity switch in which, as a function of a temperature sensor signal, a modifying circuit or discriminator, i.e. a switching threshold is controlled. Alternatively it is also possible to vary, as a function of the temperature signal, the gain of an operating/measuring circuit associated with the oscillator.

In order to improve the temperature compensation of a resonant circuit coil compared with known solutions with a NTC resistor, DE 39 26 083 A1 proposes using the core of a resonant circuit coil as the temperature sensor. As a function of a signal supply by said temperature sensor a linearized control device controls a current source, which is switched in an emitter-collector circuit of a resonant circuit transistor. This control takes place in such a way that temperature-caused changes to the resonant circuit current are compensated.

A detector for detecting living bodies, in which there is also a temperature compensation, forms the subject matter of EP 0 744 631 A1.

U.S. Pat. No. 4,956,606 relates to a contactless operating inductive measuring system, particularly for measuring the level of a molten aluminium bath. In order to compensate an output signal with respect to temperature variations, the measuring signals of temperature sensors are recorded and evaluated by a temperature compensation circuit. There is no direct effect of these temperature signals on the oscillator electronics.

DE 34 25 662 A1 and DE 196 40 677 A1 describe variants for compensating temperature effects in quartz oscillators.

The object of the invention is to provide a proximity switch and a method for its operation, through which there is a more stable function over a considerable temperature range and with increased switching intervals.

This problem is solved by the proximity switch and method for operating the proximity switch in accordance with embodiments of the present invention.

Preferred embodiments of the inventive proximity switch and advantageous variants of the inventive method form the subject matter of the subclaims.

The proximity switch of the aforementioned type is inventively further developed in such a way that the oscillator amplifier has an amplifier component and a controllable network for controlling the gain of the oscillator amplifier, that the controllable network has a passive coupling network, particularly negative feedback network, and a controllable transconductance amplifier for controlling a transfer function of the controllable network, that a temperature sensor for determining the temperature of at least the oscillator amplifier is provided and a signal derived from an output signal of the temperature sensor is used as a control signal for the transconductance amplifier, and that the oscillator amplifier on the basis of the temperature determined by the temperature sensor by means of the transconductance amplifier is controllable in such a way that temperature-caused variations of the oscillator characteristics are at least partly compensatable.

Preferably the oscillator amplifier is largely self-compensated. For example, the feedback network and/or oscillator amplifier can at least be linearly nominally self-compensated.

Temperature-caused transmission variations of the feedback network or oscillator amplifier can be largely, particularly in the first order, compensated in the case of the inventive proximity switch.

Temperature-caused transmission variations of the feedback network can e.g. arise due to individual differences in the installation conditions of the coil system or also due to parameter variations and manufacturing tolerances.

Thus, an oscillator amplifier can be obtained having a controllable construction, which provides a temperature sensor for determining its temperature and on the basis of the temperature determined by the temperature sensor is controllable in such a way that temperature-caused transmission variations of the feedback network resulting from individual installation conditions of the coil system or parameter variations and manufacturing tolerances, can at least largely and in particular in linear approximation be compensated.

Temperature-caused variations can in the case of oscillator amplifiers, which are admittedly nominally self-compensated, also arise due to parameter variations within the oscillator amplifier.

The method of the aforementioned type is inventively characterized in that with a temperature sensor is determined a temperature of at least the oscillator amplifier, that as the oscillator amplifier is used an amplifier component with a controllable network, which has a passive coupling network and a controllable transconductance amplifier, that a transfer function of the controllable network is controlled with the transconductance amplifier and a signal derived from an output signal of the temperature sensor is used as the control signal for the transconductance amplifier, and that the transfer function of the network is so controlled as a function of at least the temperature measured by the temperature sensor by means of the gain variation at the transconductance amplifier, that temperature-caused variations of the oscillator are at least partly compensated.

The transconductance amplifier is preferably a controllable differential amplifier.

The essence of the present invention is that in a construction with an oscillator amplifier and a largely self-compensated feedback network a controllable network is provided in the oscillator amplifier for compensating component variations and/or for compensating higher order temperature dependences and is controlled in such a way that remaining temperature-caused variations of characteristics of the feedback network emanating from the individual installation conditions of the coil system, i.e. the resonant circuit impedance and/or other components, are largely compensated.

A first essential advantage of the invention is that, compared with the prior art solutions, the proximity switch has a very simple construction and can therefore be inexpensively manufactured.

The method according to the invention only involves a few steps, so that also in this way costs can be saved.

Finally, with the aid of the proximity switch and method according to the invention, greatly increased switching intervals can be obtained.

In principle, with the proximity switch and method according to the invention an inexpensive batch compensation can take place.

With the proximity switch according to the invention the oscillator amplifier has an amplifier component and a controllable network for controlling the oscillator amplifier gain.

It is fundamentally possible for the feedback network influenceable by the target to be provided in the negative feedback branch and the controllable network in the positive feedback branch of the amplifier component. However, preference is given to a variant in which the feedback network influenceable by the target is provided in the positive feedback branch and the controllable network in the negative feedback branch of the amplifier component. The feedback network can then also be called a positive feedback network and the controllable network can be called a negative feedback network.

A construction in which the feedback network influenceable by the target is switched in the negative feedback branch of the amplifier and the controllable network, including the active shunt, is placed in the positive feedback branch of the amplifier, would make no change to the basic function and only the action direction would be reversed. Thus, if in the case of the presently preferred variant a damping through a transmission reduction led to a breakdown of the oscillation or at least to a reduction of the oscillation amplitude, in the case of the above-described modified variant the reverse behaviour would arise.

According to the invention, the controllable network has a passive coupling network, particularly a negative feedback network, and a controllable, active influencing device. This can be implemented inexpensively from the circuitry standpoint. Preferably the passive negative feedback network is also constructed in temperature-stable manner.

According to the invention, the controllable active influencing device is constituted by a controllable transconductance amplifier, which is in particular controllable with the aid of a control voltage and/or a control current. Use can be made of known components.

An at least linear, nominal self-compensation of the feedback network can be brought about if said feedback network has a bifilar coil with a first and a second winding, said first and said second windings being formed form multiple strands with different strand numbers, i.e. different numbers of strand wires and different strand wire thicknesses.

According to a particularly preferred variant of the inventive proximity switch, the first winding is formed from a single wire and the second winding from a multiple strand. Such an arrangement leads to excellent self-compensation of the coil system, particularly the temperature dependence of copper losses.

A further advantage of the bifilar coil is that no additional losses are introduced into the system by temperature compensation measures.

To avoid disadvantages during manufacture, in this connection and in the preferred variant it is also advantageous if the single wire or stranded wires of the first winding have a larger cross-section than the stranded wires of the multiple strand of the second winding. This improves the handling and in particular the solderability of the single wire.

Basically, with a coil the aim is always to have the single wires of the strand as thin as possible, so as to keep to a minimum the proximity losses resulting from eddy current losses in adjacent wires. For handling reasons it is not however possible to make the single wires randomly thin, because otherwise they would e.g. burn during soldering.

Good handling of the single wire of the first winding in the preferred variant can be obtained with still acceptable proximity losses if the thickness of the single wire of the first winding is between 60 and 100 μm, preferably approximately 70 μm.

In the case of the multiple strands of the second winding, with a view to ease of processing, also smaller diameters are possible but not obligatory. A still adequately reliably processable multiple strand with acceptable proximity losses is obtained if the thickness of the single wires of the multiple strand of the second winding is between 20 and 50 μm, preferably approximately 30 μm.

Basically, it is also conceivable that on approaching the target a variation to the transmission of the positive feedback network is brought about through a change to the resonant circuit capacitance, i.e. a capacitive proximity switch is involved. However, the proximity switch is preferably constructed as an inductive proximity switch.

For the construction of the largely self-compensated oscillator amplifier use is preferably made of an amplifier component with a maximum open loop gain combined with a strong negative feedback, comprising a passive negative feedback branch and a parallel-controllable, active negative feedback branch. As a result of the strong negative feedback, the oscillator amplifier can be looked upon as an almost ideal amplifier, whose input impedance and transmission and therefore whose loop and voltage gain are largely independent of the modulation and temperature. The oscillator amplifier preferably has a gain characteristic variable by a control voltage or control current and which can be shifted substantially parallel by the control magnitude or value. Preferably there is a substantially linear relationship between the shift and control value, so that the gain control can be implemented in a particularly simple manner from the circuitry standpoint. It is finally advantageous for the link between the gain characteristic shift and the control value to be largely temperature-independent, i.e. for the gain change to be substantially independent of the modulation and temperature.

The oscillator amplifier can in particular be a strong negative feedback amplifier with a defined relationship between gain and modulation. Alternatively there can be a defined relationship between the voltage gain or gain change and modulation.

It is also advantageous if the negative feedback amplifier has a defined characteristic with respect to temperature and gain, particularly a linear or constant characteristic in uninfluenced operation. This is understood to mean a situation where there is no influencing by the control voltage, i.e. nominal impedances are present in the positive and negative feedback branch, respectively.

Appropriately use is made of an oscillator with a defined impedance characteristic over temperature and frequency.

There can be a change to the gain of the oscillator amplifier through an active or passive influencing of the impedance in the negative feedback branch of the oscillator amplifier. It is e.g. possible to influence the negative feedback impedance by HF-fit, switchable impedance arrays or impedance chains.

According to the invention the influencing of the impedance takes place in controllable manner through a control value with a transconductance amplifier. This construction can also be referred to as an active shunt.

The voltage can be coupled into the resonant circuit via a random impedance, e.g. also an ohmic resistor. However, it is particularly appropriate, because then no further components are needed to provide the correct phase position, if a coupling capacitor is provided for coupling the voltage into the resonant circuit. Appropriately an ohmic resistor is connected in series with the coupling capacitor for impedance matching purposes.

In a further preferred embodiment a rectifier and a comparator with a fixed switching threshold are connected in series behind the oscillator amplifier. The use of a comparator with fixed switching threshold is particularly possible and useful if the amplifier used has a constant gain over a particularly wide modulation range. The changeover between the minimum amplitude at close to 0 and the maximum amplitude then takes place over a particularly small path distance of the target influencing the coil system, so that high accuracy demands do not have to be made concerning the specific switching threshold. This makes it possible to reduce the circuitry expenditure and other costs.

Another advantage of an active shunt is that the gain of the oscillator amplifier is modified, essentially without intervening in the linearity characteristics of said amplifier.

The temperature sensor can fundamentally be constituted by all known variants, particularly thermocouples or semiconductor components specifically provided for this purpose. In a preferred variant of the inventive proximity switch the temperature sensor is constituted by a NTC network. NTC networks have an adequate linearity and acceptable costs.

To permit a rapid preoscillation of the oscillator, it has also proved appropriate for the oscillator amplifier gain to be modified in modulation-dependent manner. The gain is increased in planned manner with small modulations or oscillation amplitudes. From the circuitry standpoint this can e.g. be implemented in that an output of the rectifier is connected to the controllable oscillator amplifier, particularly the amplifier component, so that the gain is modified in modulation-dependent manner, namely as a function of the voltage supplied by the rectifier.

Particularly preference is given to a variant of the inventive method in which the oscillator amplifier gain is linearly tracked piecemeal over temperature. This is understood to mean a procedure in which in the case of a plurality of points there is a compensation of the gain and subsequently between said points there is a linear interpolation of the gain characteristic. In a particularly simple, but still very effective variant, e.g. at three temperatures a compensation of the gain takes place and this is followed by a linear interpolation between these three points. In this case the gain characteristic consists of two linear partial ranges. This economic procedure, which is also known as three-point compensation, has proved completely adequate for numerous applications.

A nonlinear interpolation, e.g. by means of a Bezier curve, is also possible and appropriate.

Another advantage of a piecemeal, linear gain characteristic is that the calculation of the individual characteristic points can take place particularly easily.

It is also possible to have a batch-related impression of the gain characteristic following spot check-based determination of the component characteristics.

The proximity switch and method according to the invention also permit a dimensioning and/or an optimization of the components used once and for all with the aid of a simulation for a specific proximity switch size.

Further advantages and features of the proximity switch and method according to the invention are explained in greater detail hereinafter with reference to the attached diagrammatic drawings, wherein show:

FIG. 1 Diagrammatically a conventional proximity switch with compensation network.

Figure 2:
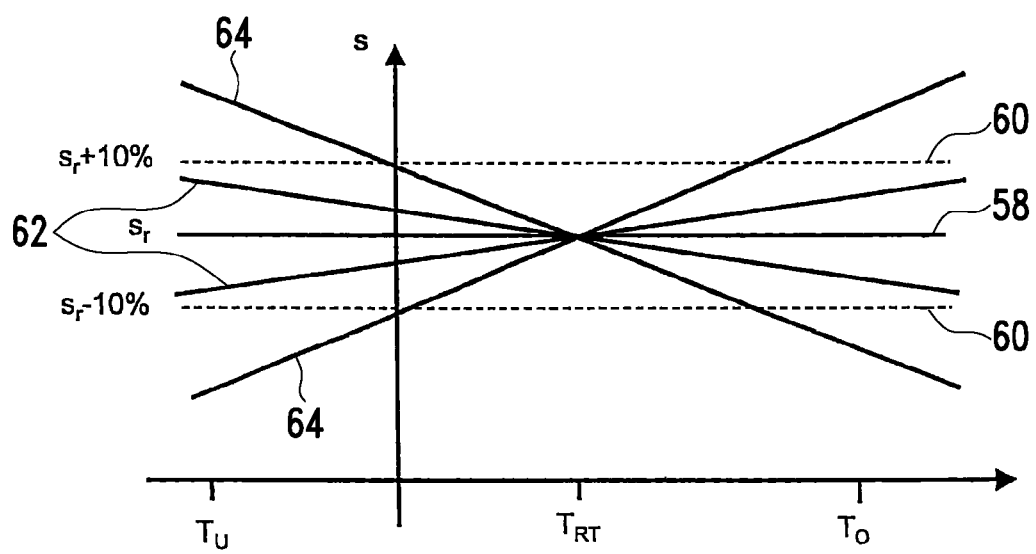

FIG. 2 A representation illustrating temperature effects on the switching interval.

Figure 3:
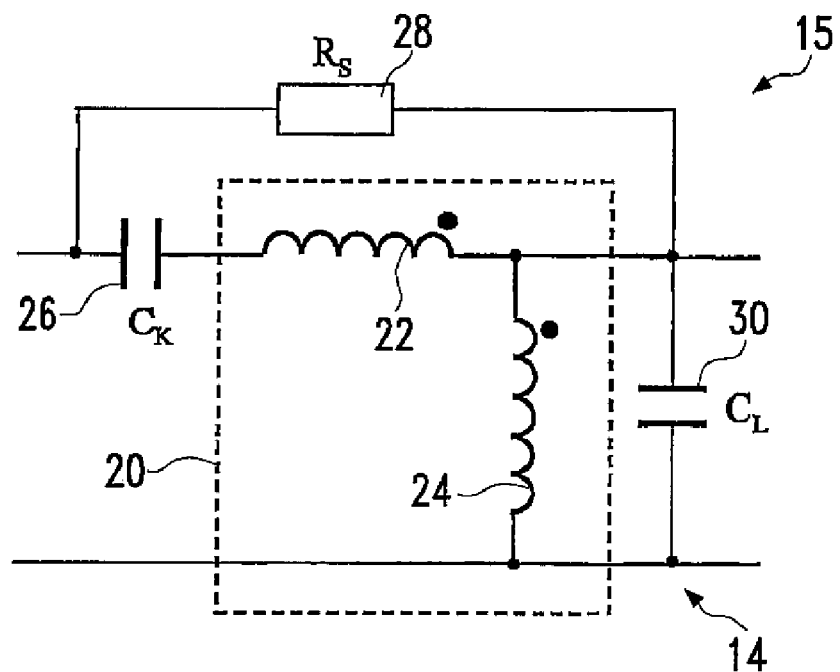

FIG. 3 A diagrammatic view of a coil network used for a preferred embodiment of the invention.

Figure 4:
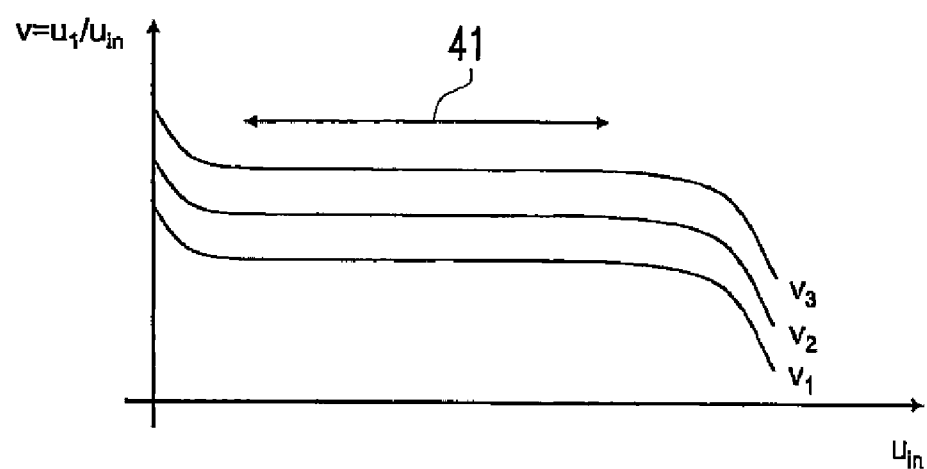

FIG. 4 A diagrammatic representation of the course of gain curves of an amplifier usable for the proximity switch according to the invention.

Figure 5:
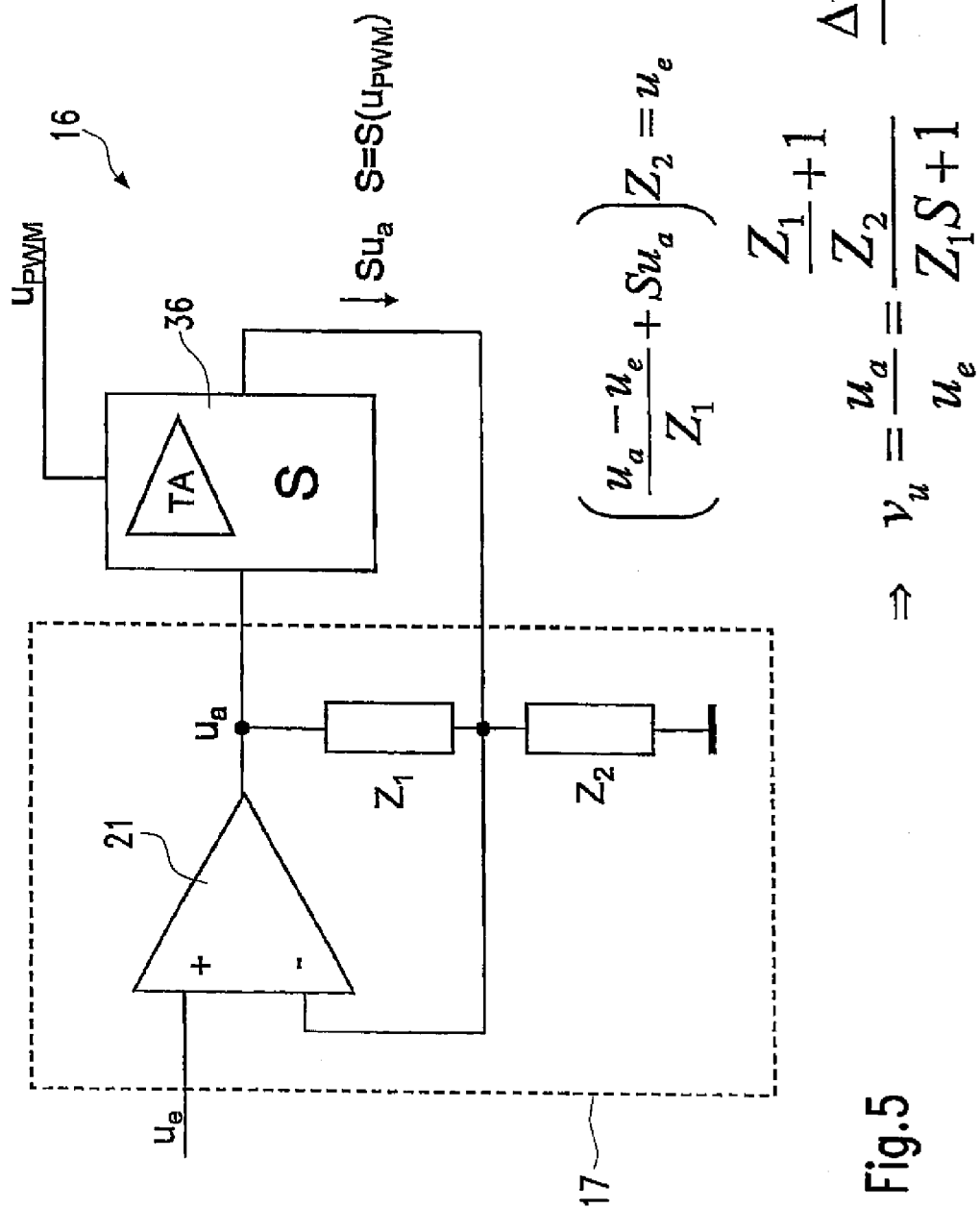

FIG. 5 A diagrammatic representation of an amplifier usable for the proximity switch according to the invention.

Figure 6:
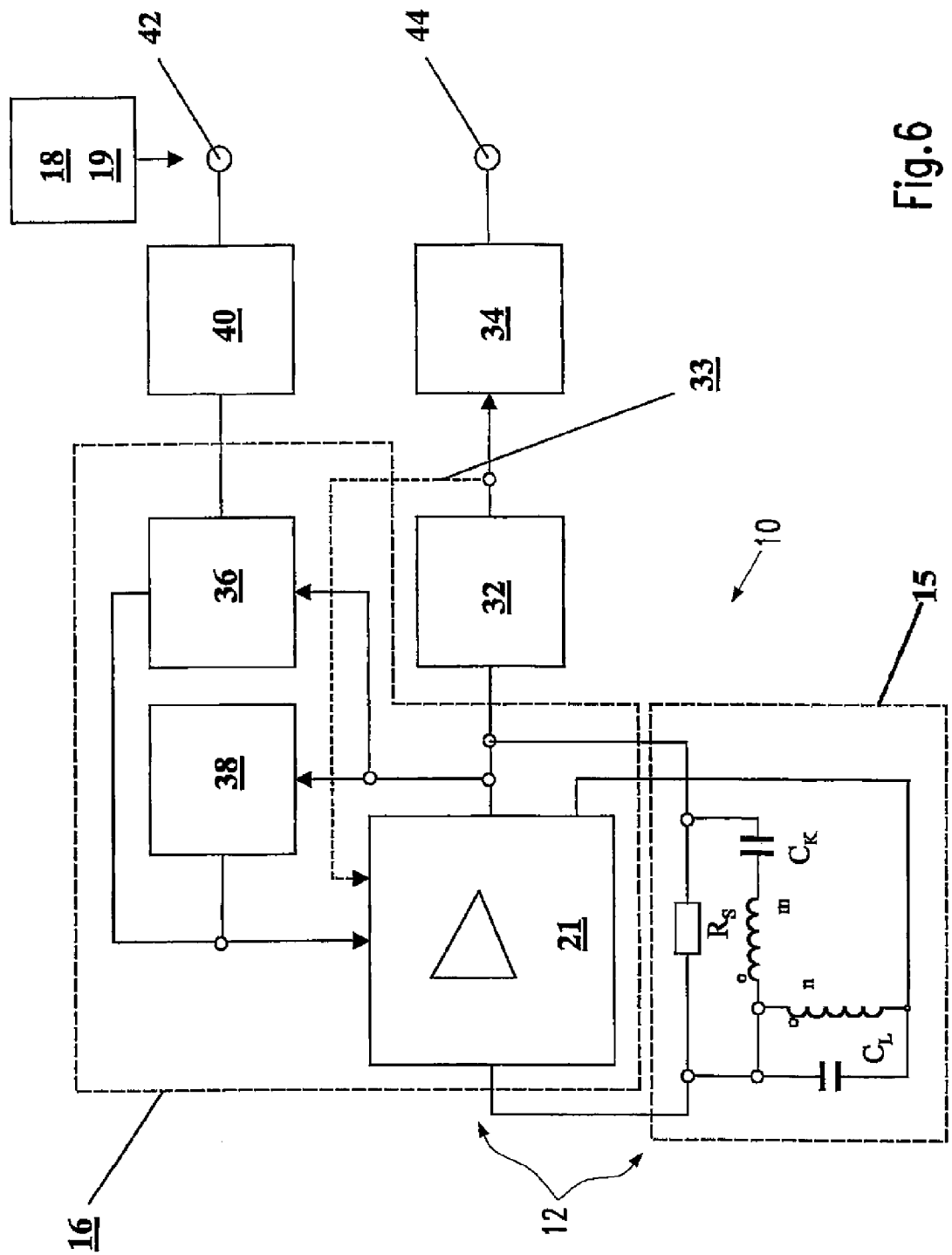

FIG. 6 A diagrammatic representation of an embodiment of the inventive proximity switch.

Figure 7:
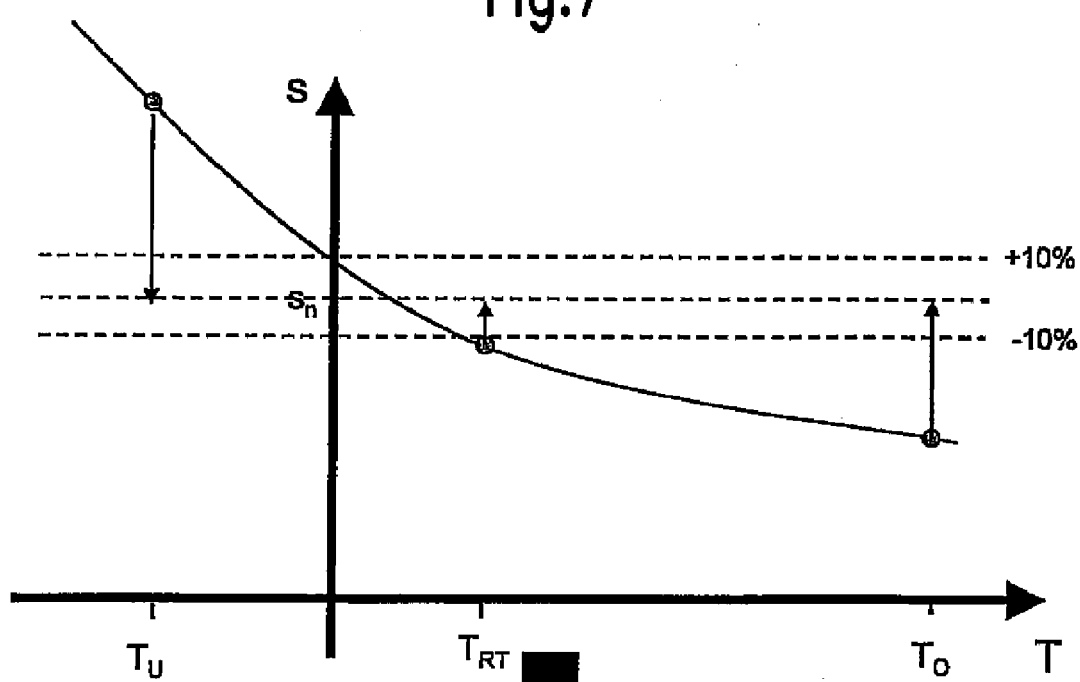

FIG. 7 A diagrammatic representation of the course of the switching interval as a function of the temperature prior to a planned gain change.

Figure 8:
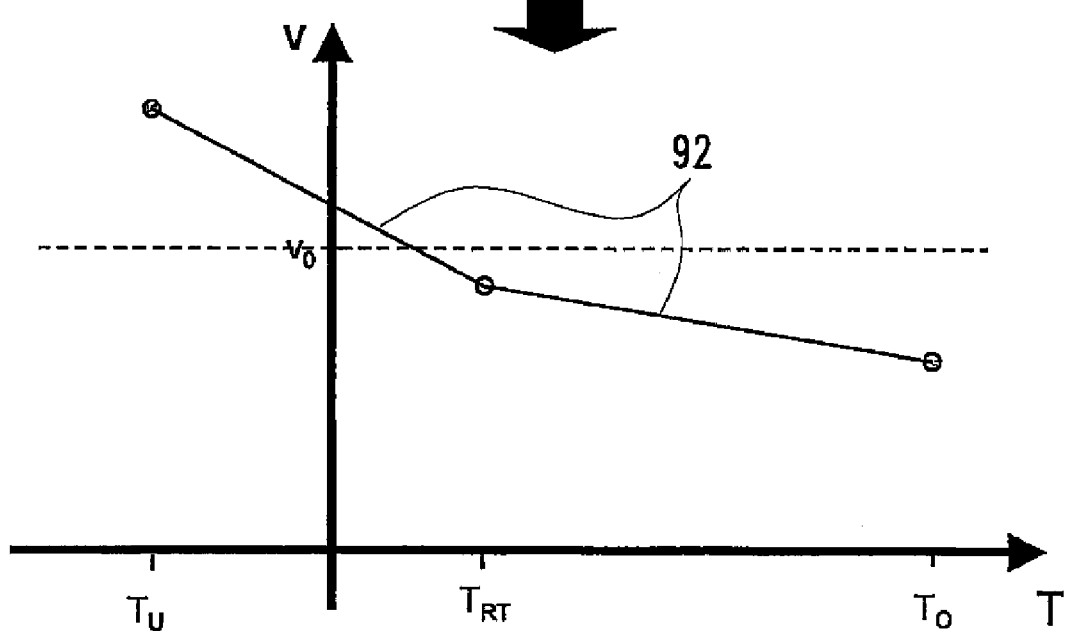

FIG. 8 A diagrammatic representation of a gain characteristic obtained from the curve in FIG. 7.

Figure 9:
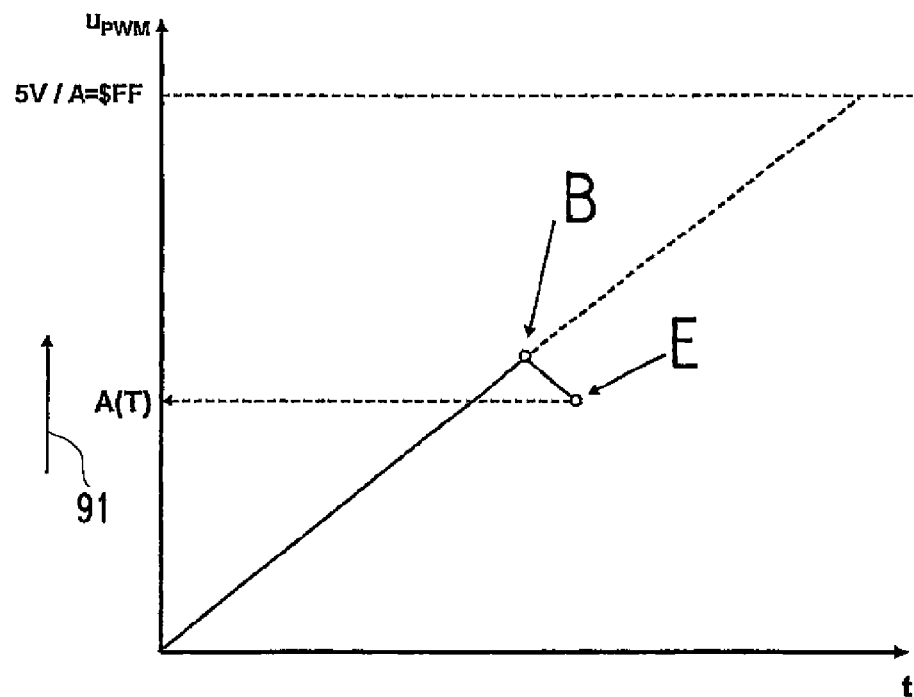

FIG. 9 A diagrammatic representation of the compensation method.

Figure 10:
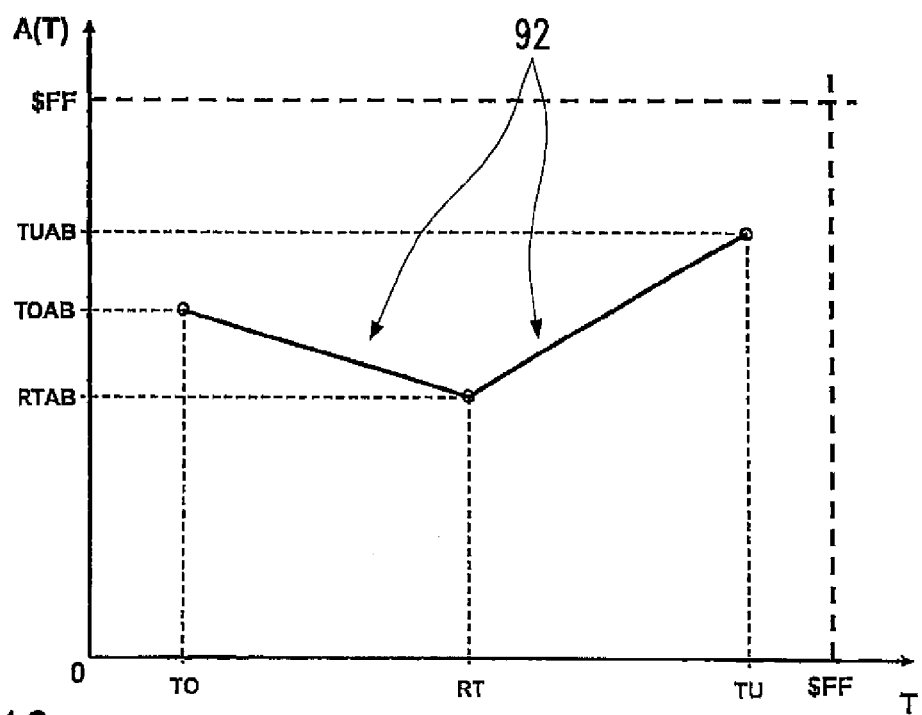

FIG. 10 A diagrammatic representation of gain tracking.

Figure 11:
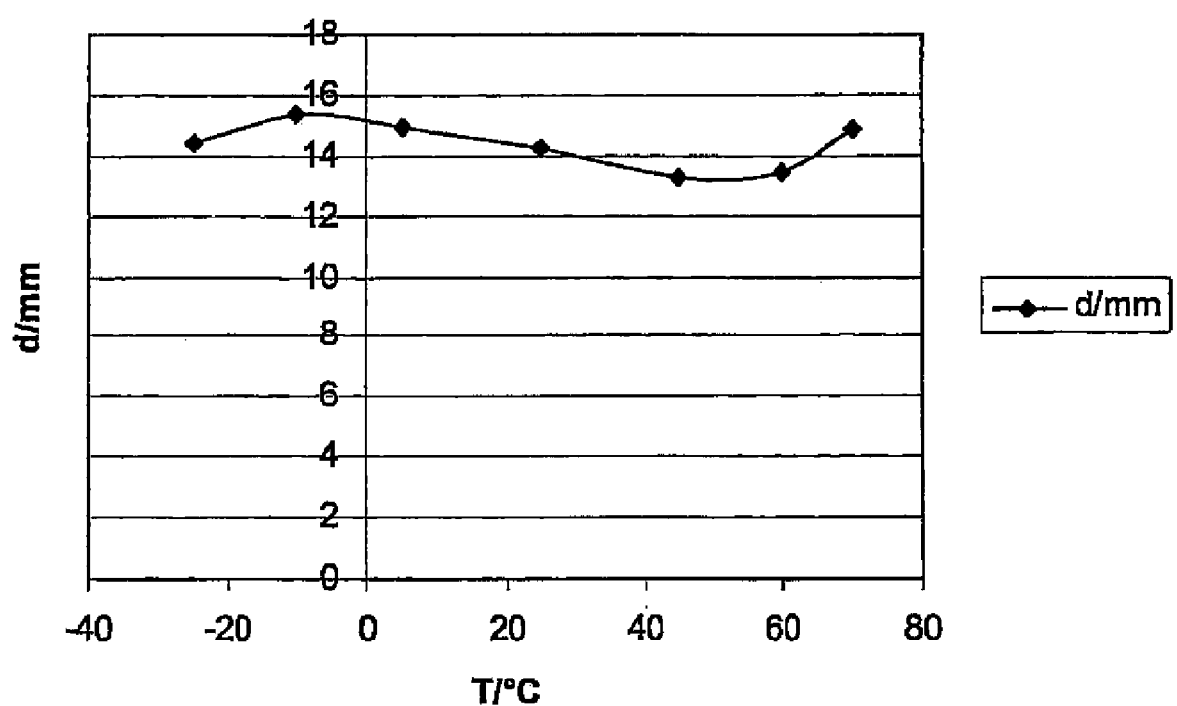

FIG. 11 The course of the switching interval for a specific prototype.

Firstly the basic set problem is explained with reference to the diagrammatic sketch of a conventional system 50 in FIG. 1. This system essentially comprises a coil system 51, an amplifier 52 and a compensation network 54 for compensating temperature dependences of the coil system and amplifier. A spatial separation of these partial components is indicated by arrows 56. For fundamental reasons the maximum switching interval attainable with a proximity switch is limited. Firstly, as a result of the spatial separation temperature differences always occur between the individual components, e.g. between the coil system and amplifier/compensation network. These not completely eliminatable temperature differences lead to tracking errors in the case of temperature changes.

It is also only possible to carry out with limited precision an adaptation or matching between the compensation network, amplifier and coil system.

Finally, the components used, particularly of the coil system and also of the amplifier, are subject to parameter variations and manufacturing tolerances limiting the reproducibility of the partial components.

The influence of these parameter variations is diagrammatically illustrated in FIG. 2. The switching interval s is plotted therein with respect to the temperature. A nominal switching interval $s_r$ is represented by a horizontal line 58. Broken horizontal lines 60 indicate a 10% deviation range with respect to said nominal switching interval $s_r$. The influence of disturbance variables on the actual switching interval is approximately exponentially dependent on the nominal switching interval.

For this reason it is observed that, on passing to higher switching intervals, there are rapidly rising variations with respect to the nominal switching interval with increasing distance from the room temperature. This is diagrammatically shown in FIG. 2 by lines 64, which are already well above the lower operating temperature $T_U$ and below the upper operating temperature $T_O$ pass beyond the 10% environment considered acceptable. An acceptable and therefore seekable curve is represented by line 62.

To obtain much greater switching intervals, the invention proposes as a first step the use of a linearly nominal, self-compensated positive feedback network and a substantially self-compensated oscillator amplifier. The self-compensation is to be influenced to a minimum by typical parameter variations or manufacturing tolerances and also higher order temperature influences are to be minimized.

An example of an inventive self-compensated oscillator, comprising an oscillator amplifier and positive feedback network, is explained relative to FIGS. 3 to 5.

FIG. 3 diagrammatically shows a network self-compensated relative to temperature. It is essentially a bifilar coil system with external wiring, whose transmission, in the case of a corresponding design, can at least in a first approximation be made temperature-independent, and is then only dependent on the damping of coil 20, e.g. by a target to be detected. The core component of this coil system is a bifilar coil 20 comprising a first winding 22 and a second winding 24. The first and second partial windings are arranged in an antiserial, intimately connected manner, so that there is a substantially complete inductive coupling between said partial windings. With regards to the manufacture of this coil system it is advantageous if the partial windings have a different construction. The first partial winding 22 preferably comprises a single wire and the second partial winding 24 preferably comprises a multiple strand. The single wire of the first winding is appropriately thicker than the single wires of the multiple strand. This avoids soldering problems and proximity losses are kept within an acceptable range. A further component of the actual resonant circuit 14 is a capacitor 30 which is connected parallel to the second winding 24 of bifilar coil 20. An input voltage is supplied to the resonant circuit 14 across a coupling capacitor 26 via first winding 22. Coupling capacitor 26 also provides the correct phase position of the exciting voltage.

By a corresponding weighting of the coupling capacitor 26 and a shunt resistor 28 a temperature compensation can be implemented. The optimization of the external wiring is performed with a nominal transmission as the boundary condition. The prerequisite for this is that the coil system is operated below the self-compensation frequency.

Compared with a conventional implementation this self-compensated positive feedback network brings about numerous advantages. Firstly there is an inherent temperature compensation through a parametrization of the external wiring. It is also possible to minimize parasitic losses, such as e.g. proximity losses, because, in principle, the two coil windings can be chosen completely independently of the components used for compensation. This structure also only has very small higher order temperature coefficients. A final advantage of this network is that the resultant temperature coefficient has a very low frequency dependence. In the case of this network, which functions as a positive feedback network in the oscillator, as described hereinbefore, there is an inherent self-compensation of transmission.

The further essential oscillator component is the oscillator amplifier. In order to be able to implement inductive sensors with greatly increased switching intervals, where the target effect is in the range of only a few thousand ppm, the oscillator amplifier used should satisfy three demands.

It is firstly desirable to have a high stability of the voltage gain over temperature. The maximum relative gain variations should be well below the target effect.

There should also be a very high linearity, i.e. the fundamental wave gain should be as constant as possible and independently of the respective gain over a wide modulation range. Small transmissions changes in the positive feedback branch occurring through the damping of the coil by the target are then imaged on a very large amplitude swing, which maximizes the signal-to-noise ratio. This more particularly relates to the signal-to-noise ratio relative to disturbance influences of the rectifier and comparator, i.e. to the ratio with respect to signal evaluation.

Finally, the amplifier should have a very high input impedance which is as constant as possible over the temperature and preferably greater than 1 Megaohm.

These demands can be met with an amplifier with a strong negative feedback. The basis for this is an amplifier component with a high open-loop gain, which is ideally initially subject to negative feedback across a passive network. In the case of a sufficiently large open loop gain the behaviour of this system is virtually exclusively determined by the passive negative feedback network, i.e. semiconductor parameters and their temperature dependences pass into the background.

On the basis of an amplifier with a strong negative feedback with a fixed predetermined, passive negative feedback network, which can be referred to as a core oscillator, the gain is controlled by a parallel extension of the negative feedback network with an "active shunt" in the form of a linearized and temperature-compensated differential amplifier. Through direct or voltage-controlled variation of the differential amplifier current there is a proportional change to its transfer transductance and therefore the influence on the negative feedback network of the core oscillator. This in turn leads to a change to the gain of the overall system. The principle functions independently of the specific implementation of the core oscillator, provided that it is a negative feedback amplifier. In this way an oscillator amplifier is obtained, which satisfies the aforementioned requirements and simultaneously offers the possibility of a gain variation with the aid of a control value. This makes it possible to obtain a software-based compensation of the proximity switch for eliminating the influences of lack of reproducibility of coil and component parameters. The gain stability, linearity and input impedance are largely independent of the gain present.

FIG. 4 diagrammatically shows three different curves of the gain for a predetermined negative feedback network, produced by three different values of the control magnitude, here the control voltage, for the differential amplifier transductance. As indicated by the double arrow 41, these curves in each case have an extended linearity range extending over a wide modulation range. As a result of this extended linearity range it is ensured that small transmission changes in the positive feedback branch are imaged on a large amplitude swing and in this way the signal-to-noise ratio is minimized. With respect to the comparator threshold, it can also be achieved thereby that no strict accuracy demands have to be made. As can also be gathered from FIG. 4, there is in each case a gain rise with limited modulations for the three curves shown. This is desired and advantageous, because this prevents a breakdown of the amplitude with small target intervals or distances and facilitates a preoscillation or uposcillation of the oscillator. With high modulations the gain in each case drops, so that the oscillator amplitude is limited.

FIG. 5 diagrammatically shows an embodiment of an oscillator amplifier 16 used in the proximity switch according to the invention. The essential component of this oscillator amplifier 16 is a core oscillator 17 comprising an amplifier component 21 and a fixed predetermined, passive negative feedback network of impedances Z1 and Z2. In addition, a transductance amplifier 36 controlled with the aid of a voltage $U_{PWM}$ is installed in the negative feedback network. As a result of the transductance amplifier 36 a current $Su_a$ is impressed in the negative feedback network, the transductance S being a function of the controlled voltage $U_{PWM}$. This arrangement leads to the dependence of the gain $v_u$ on the transductance S of transductance amplifier 36 shown in FIG. 5.

The amplifier can e.g. be configured in such a way that the gain variation over the control voltage is approximately +/−2%. The residual temperature influences are ideally much smaller than the useful signal, i.e. smaller than typically 0.3%.

FIG. 6 shows in a diagrammatic partial representation an embodiment of an inventive proximity switch 10. The core component of this inductive proximity switch 10 is the previously described, linear, self-compensated oscillator 12 with positive feedback network 15 and oscillator amplifier 16. As described hereinbefore relative to FIG. 5, the oscillator amplifier 16 comprises the actual amplifier component 21, a predetermined, passive negative feedback network 38 and the transductance amplifier 36 permitting an overall adjustment of the gain of amplifier 16. Amplifier component 21 is coupled via the positive coupling network 15. A control signal is supplied to the transductance amplifier 36 either directly or from a voltage/current converter 40. This control signal is derived from an output signal of an inventively provided temperature sensor 18, which is connected directly or via intermediate components with an input 42 of converter 40 or is directly connected to the transductance amplifier. Temperature sensor 18 in the case shown is a NTC network 19.

The output signal of amplifier component 21 is rectified with the aid of a rectifier 32 and is then supplied to a comparator 34, which compares the rectified voltage value with a fixed comparator threshold and as a result of this comparison emits an output signal 44. In the embodiment shown the output of rectifier 32 is also returned via a diagrammatically indicated line 33 to amplifier component 21. The circuit is constructed in detail in such a way that with a low modulation of amplifier component 21 or a low oscillation amplitude in planned manner a gain increase is brought about in order to prevent the breakdown of the oscillation amplitude and to facilitate the uposcillation of oscillator 12.

The inventive method, particularly the obtaining of the relationship between gain and temperature is explained hereinafter relative to FIGS. 7 to 10.

FIG. 7 shows the typical curve of the switching interval as a function of the temperature. As can be seen, in the vicinity of a lower operating temperature $T_U$ and an upper operating temperature $T_O$ there are already considerable deviations from a nominal switching interval $S_n$ extending well beyond the 10% framework. At the low operating temperature $T_U$ there is a much too great switching interval. This means that the oscillator damping by the target already in the case of an interval which is much greater than the nominal switching interval is sufficient to stop the oscillation of the oscillator or to drop below the comparator switching threshold. Therefore a higher gain must be chosen for this temperature. At the upper operating temperature $T_O$ the switching interval observed is too low, i.e. the target must be brought much closer than the switching interval at the proximity switch in order to bring about adequate oscillator damping. This means that for this temperature $T_O$ the gain was excessive and must consequently be reduced. In a similar manner the gain must also be slightly reduced at room temperature $T_{RT}$. In this way the three gain compensation points shown in FIG. 8 are obtained. A gain curve over the entire range of operating temperatures from $T_U$ to $T_O$ can, as indicated by arrows 92, in simple manner be achieved by linear interpolation between the values determined at the three indicated temperatures.

Thus, in the method according to the invention, at a few and preferably three checkpoints in the desired temperature range the values for the control voltage are determined and the corresponding correction values are filed in a nonvolatile memory. On the basis of the measuring signal of temperature sensor 18, then the specific control values of the control voltage or control current, e.g. with the aid of a microprocessor or microcontroller, can in each case undergo punctiform calculation. The control voltage is then generated by a digital-analog converter or by low-pass filtering of a PWM source using these control values. Control voltage tracking then takes place in the temperature range as interpolation using the correction values found or, if desired, with a parametrizable higher order function, e.g. with the aid of a Bezier approximation. A communication with the microprocessor or microcontroller can e.g. take place by means of supply lines, a bidirectional transfer of the correction or control values and other informations and instructions being possible.

Alternatively the entire gain curve can be filed in a memory. A punctiform calculation of the control values is not then necessary.

It is alternatively possible to control the transductance amplifier by means of a control current.

FIG. 9 diagrammatically illustrates the determination of the correction values. The target is positioned in the switching interval and, on the basis of a value at which the oscillator in any case oscillates, the gain is gradually lowered. On the Y axis in FIG. 9 is plotted the voltage $U_{PWM}$, which increases with decreasing gain. Thus, the gain decreases in the direction of arrow 91. Movement takes place in this way to a point B, where the "damped" state is reached. Subsequently the gain is increased so far, until the oscillator just oscillates, i.e. a "dedamped" state is reached at point E. This correction value A(T) is filed in an EEPROM together with the corresponding temperature (T).

From the correction values determined at three temperatures, as indicated by arrows 92 in FIG. 10, the curve for the entire operating temperature range is then established by linear interpolation. On the X axis in FIG. 10 is plotted a temperature parameter T, which decreases with rising temperature. Thus, there TU appears above the "room temperature" RT.

Finally, FIG. 11 shows a course of the switching interval in the operating temperature range from −25 to +70° C. determined for a specific prototype. As can be seen, with a switching interval of approximately 15 mm, the maximum deviation can be kept below 10%.

The present invention provides a novel proximity switch and a novel method for operating a proximity switch leading to considerable improvements with respect to the switching interval and temperature stability. The invention involves essentially a combination of a self-compensated oscillator and an adjustable oscillator amplifier. In particular, use can be made of a comparator with a fixed threshold. The oscillator amplifier is preferably a low drift amplifier with adjustable transductance or gain in the negative feedback branch. This leads to a single-stage method, which only requires the recording of a small number of checkpoints. In this way it is possible to compensate in a single-stage method statistical tolerances, temperature-caused tolerances and temperature-caused parameter changes.

The higher order temperature dependences can be further reduced when using substantially temperature-stable components, particularly for the self-compensated oscillator and low drift amplifier.

The invention claimed is:

1. A proximity switch, comprising:
    an oscillator comprising an at least partly self-compensated feedback network influenceable by a target to be detected;
    an oscillator amplifier comprising an amplifier component and a controllable feedback network for controlling a gain of the oscillator amplifier, the controllable feedback network including a passive coupling network;
    a controllable transconductance amplifier for controlling a transfer function of the controllable feedback network;
    a temperature sensor for determining a temperature of at least the oscillator amplifier, in which a signal derived from an output signal of the temperature sensor is used as a control signal for the transconductance amplifier; and
    the oscillator amplifier, based on the temperature determined by the temperature sensor, is controllable via the transconductance amplifier such that temperature-dependent variations of characteristics of the oscillator are at least partly compensatable.

2. The proximity switch according to claim 1, wherein the self-compensated feedback network influenceable by the target is provided in a positive feedback branch of the amplifier component, and wherein the controllable feedback network is provided in a negative feedback branch of the amplifier component.

3. The proximity switch according to claim 1, wherein the self-compensated feedback network influenceable by the target is provided in a negative feedback branch of the amplifier component, and wherein the controllable feedback network is provided in a positive feedback branch of amplifier component.

4. The proximity switch according to claim 1, wherein the transconductance amplifier is controllable by a control voltage or a control current.

5. The proximity switch according to claim 1, wherein the self-compensated feedback network comprises a bifilar coil with a first and a second winding, and wherein the first winding is formed by a single wire and the second winding is formed by multiple strands.

6. The proximity switch according to claim 5, wherein a thickness of the single wire of the first winding is between about 60 μm and about 100 μm.

7. The proximity switch according to claim 6, wherein the thickness of the single wire of the first winding is about 70 μm.

8. The proximity switch according to claim 5, wherein a thickness of each strand of the multiple strands of the second winding is between about 20 and about 50 μm.

9. The proximity switch according to claim 8, wherein the thickness of each strand of the multiple strands of the second winding is about 30 μm.

10. The proximity switch according to claim 5, wherein the first winding and second winding are formed with different strand wire thicknesses, the single wire of the first winding having a larger cross-section than the stranded wires of the multiple strands of the second winding.

11. The proximity switch according to claim 1, further comprising: a rectifier and a comparator with fixed switching threshold connected in series behind the oscillator amplifier.

12. The proximity switch according to claim 11, wherein an output of the rectifier is connected to the amplifier component for modulation-dependent gain change purposes.

13. The proximity switch according to claim 1, wherein the self-compensated feedback network further comprises:
    a coupling capacitor for coupling in an output voltage of the oscillator amplifier; and
    an ohmic resistor.

14. The proximity switch according to claim 1, wherein a NTC network is used as the temperature sensor.

\* \* \* \* \*